US012596159B2

(12) United States Patent
Ricotti et al.

(10) Patent No.: US 12,596,159 B2
(45) Date of Patent: Apr. 7, 2026

(54) MULTI-WIRE BONDING TEST CIRCUIT FOR A CONVERTER

(71) Applicant: STMicroelectronics International N.V., Geneva (CH)

(72) Inventors: Giulio Ricotti, Broni (IT); Alessandro Sacca', Milan (IT); Valeria Bottarel, Novara (IT); Niccolo' Brambilla, San Donato Milanese (IT)

(73) Assignee: STMicroelectronics International N.V., Geneva (CH)

( * ) Notice: Subject to any disclaimer, the term of this patent is extended or adjusted under 35 U.S.C. 154(b) by 200 days.

(21) Appl. No.: 18/459,999

(22) Filed: Sep. 1, 2023

(65) Prior Publication Data

US 2025/0076413 A1     Mar. 6, 2025

(51) Int. Cl.
*G01R 31/66* (2020.01)
*H02M 3/158* (2006.01)

(52) U.S. Cl.
CPC ............ *G01R 31/66* (2020.01); *H02M 3/158* (2013.01)

(58) Field of Classification Search
CPC .... G01R 31/66; H02M 3/158; H02M 1/0009; H02M 1/32; H02M 3/003
See application file for complete search history.

(56) References Cited

U.S. PATENT DOCUMENTS

| | | |
|---|---|---|
| 5,793,126 A | 8/1998 | Gray |
| 5,909,034 A | 6/1999 | Soldavini et al. |

| | | | |
|---|---|---|---|
| 7,960,983 B2 | 6/2011 | Suto | |
| 10,067,175 B2 | 9/2018 | Ramirez et al. | |
| 2008/0061795 A1* | 3/2008 | Tanaka ............... | G01R 31/2853 |
| | | | 324/537 |
| 2011/0254143 A1* | 10/2011 | Chen ....................... | H01L 24/06 |
| | | | 257/676 |
| 2021/0175804 A1* | 6/2021 | Shumkov ............ | H02M 3/1582 |
| 2022/0206057 A1 | 6/2022 | Wada | |
| 2023/0052235 A1 | 2/2023 | Wada | |
| 2023/0353048 A1* | 11/2023 | Fletcher ................ | H02M 1/009 |

FOREIGN PATENT DOCUMENTS

| | | |
|---|---|---|
| JP | 2009025044 A | 2/2009 |

* cited by examiner

*Primary Examiner* — Akm Zakaria

(74) *Attorney, Agent, or Firm* — Seed Intellectual Property Law Group LLP

(57)     ABSTRACT

Provided is a power converter including first, second, third and fourth nodes and a wire bonding test circuit. The wire bonding test circuit includes a multiplexer having a first terminal of a first side coupled to the first node and second and third terminals of a second side. The wire bonding test circuit includes a first switch having a first terminal coupled to the second terminal or the third terminal of the multiplexer and a second terminal coupled to the second node. The wire bonding test circuit includes a second switch having a first terminal coupled to the second terminal or the third terminal of the multiplexer and a second terminal coupled to the third node. The wire bonding test circuit includes a third switch having a first terminal coupled to the second terminal or the third terminal of the multiplexer and a second terminal coupled to the fourth node.

19 Claims, 5 Drawing Sheets

MULTI-WIRE BONDING TEST CIRCUIT FOR A CONVERTER

BACKGROUND

Technical Field

This application is directed to a multi-wire bonding test circuit for a power converter, such as a DC-DC converter.

Description of the Related Art

In many applications, such as automotive applications, in-package final product testing is performed to qualify that a product (such as a DC-DC converter) meets a certain standard or to certify that the product meets the standard. Guidelines may set forth the tests to be performed for the qualification or certification. Automated test equipment (ATE) may perform the testing and fault diagnosis of the packaged circuit.

BRIEF SUMMARY

Provided is a multi-wire bonding test circuit. The multi-wire bonding test circuit is coupled to a converter (or half-bridge thereof). The multi-wire bonding test circuit provides connections that enable testing supply, switching and reference multi-wire bonding of the converter. Each of the supply, switching and reference multi-wire bonding may be coupled to a respective pin of the converter or package thereof. The multi-wire bonding test circuit includes a multiplexer and switches. The multiplexer and switches operate to create a respective path between each respective pin of the supply, switching and reference multi-wire bonding and a feedback pin. Voltage and/or current measurements may be made between a multi-wire bonding pin and the feedback pin to determine whether the wires are appropriately bonded and conductive.

The high-side and low-side transistors of the half-bridge are also operated during a test mode between conductive and non-conductive states to enable current flow paths between the supply, switching and reference pins.

DETAILED DESCRIPTION

Figure 1:
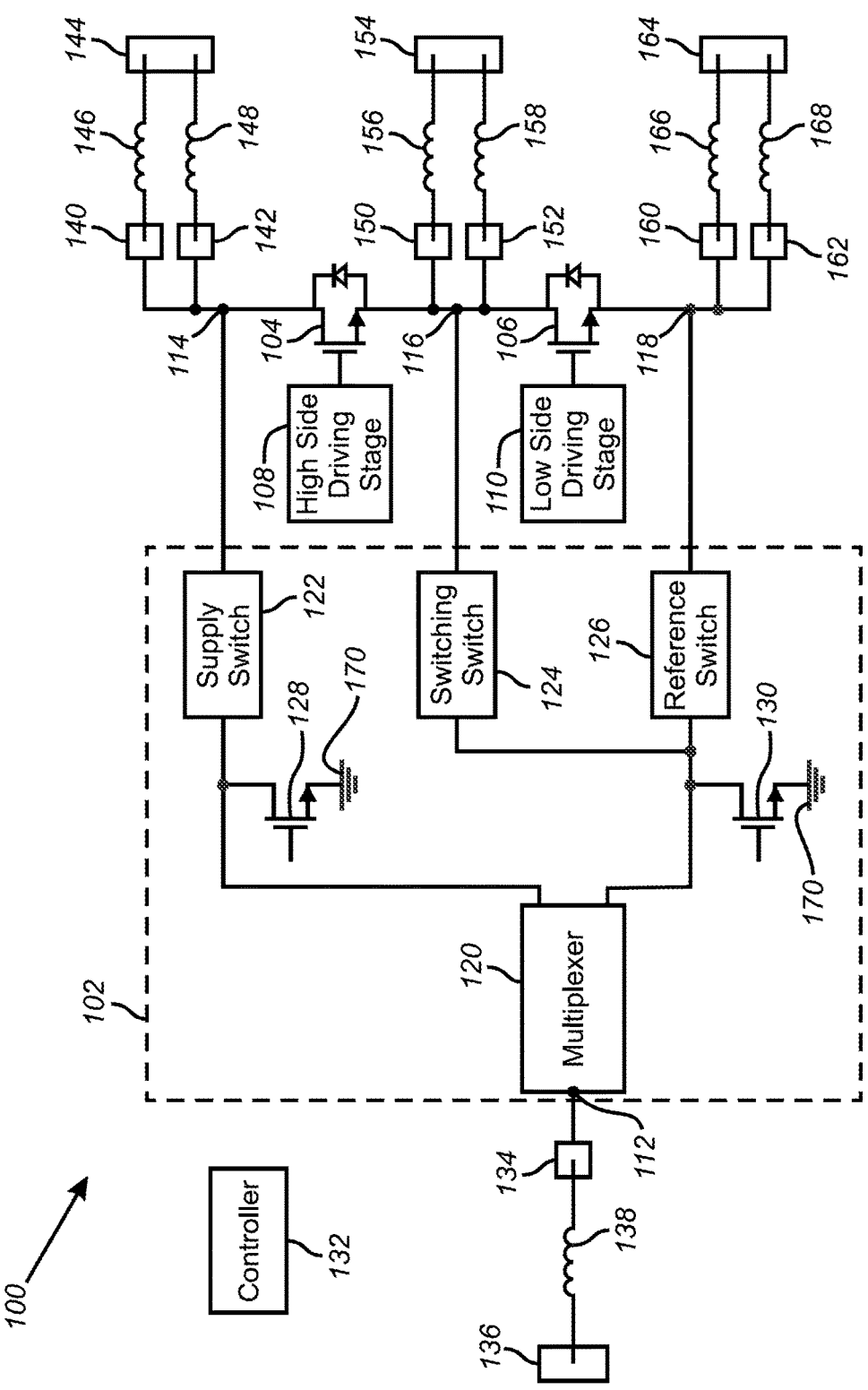
FIG. 1 shows a circuit diagram for a converter including a wire bonding test circuit.

FIG. 1 shows a circuit diagram for a converter 100 including a wire bonding test circuit 102. Although reference to a converter is made, the wire bonding test circuit 102 is coupled to a half-bridge of the converter 100 including a high side transistor 104, the low side transistor 106, a high side driving stage 108 and a low side driving stage 110.

The circuit 102 has feedback, supply, switching and reference nodes 112, 114, 116, 118. The wire bonding test circuit 102 includes a multiplexer 120, supply, switching and reference switches 122, 124, 126 and first and second clamp transistors 128, 130. The converter 100 also includes a controller 132. The controller 132 controls the high side and low side driving stages 108, 110 for operating the converter or half-bridge thereof. The controller 132 controls the multiplexer 120, supply, switching and reference switches 122, 124, 126 and the first and second clamp transistors 128, 130 for testing the wire bonding of the converter 100 or chip thereof as described herein. Although reference herein is made to feedback pin, node and pad, it is noted that any other pin (or node or pad) may be used for or repurposed for testing as described herein. Any pin (or node or pad) may be designated as feedback to enable the testing and voltage measurement described herein.

The feedback node 112 is coupled to a feedback pad 134, and the feedback pad 134 is coupled to a feedback pin 136 using a feedback bonding wire 138. The feedback pin 136 (and associated feedback node 112 and feedback pad 134) may be any fourth pin of the circuit. The feedback pin 136 may be not used as a working pin and may not have a working function during the test mode operation described herein. Consequently, the feedback pin 136 may be a fourth pin that is available for use or repurposing during testing. The supply node 114 is coupled to the first and second supply pads 140, 142. The first supply pad 140 is coupled to a supply pin 144 of the converter using a first supply bonding wire 146, and the second supply pad 142 is coupled to the supply pin 144 using a second supply bonding wire 148. The use of two pads 140, 142 and two bonding wires 146, 148 to couple the supply node 114 to the supply pin 144 provides redundancy, whereby if one of the two pins fails becoming decoupled, the other pin provides a connection between the supply node 114 and the supply pin 144. The use of two bonding wires also reduces the parasitic components introduced by the bonding connection.

Similarly, the switching node 116 is coupled to first and second switching pads 150, 152. The first switching pad 150 is coupled to a switching pin 154 of the converter using a first switching bonding wire 156, and the second switching pad 152 is coupled to the switching pin 154 using a second switching bonding wire 158. Additionally, the reference node 118 is coupled to first and second reference pads 160, 162. The first reference pad 160 is coupled to a reference pin 164 of the converter using a first reference bonding wire 166, and the second reference pad 162 is coupled to the reference pin 164 using a second reference bonding wire 168.

In the converter 100, the high side transistor 104 has a first conduction terminal coupled to the supply node 114, a second conduction terminal coupled to the switching node 116 and a control terminal coupled to an output of the high side driving stage 108. The high side driving stage 108 outputs a high side driving signal to operate the high side transistor 104. The low side transistor 106 has a first conduction terminal coupled to the switching node 116, a second conduction terminal coupled to the reference node 118 and a control terminal coupled to an output of the low side driving stage 110. The low side driving stage 110 outputs a low side driving signal to operate the low side transistor 106.

The supply node 114 and the supply pin 144 may provide a supply voltage to the converter 100. The switching node 116 and the switching pin 154 are operable to be coupled to an inductance or a transformer of the converter and may couple the half-bridge stage to the inductance or transformer. The reference node 118 and the reference pin 164 may provide a reference voltage (e.g., a ground voltage) to the converter 100.

The supply switch 122 has a first terminal coupled to the supply node 114 and a second terminal. The switching switch 124 has a first terminal coupled to the switching node 116 and a second terminal. The reference switch 126 has a first terminal coupled to the reference node 118 and a second terminal. The multiplexer 120 has a terminal of a first side coupled to the feedback node 112. The multiplexer 120 has a first terminal of a second side coupled to the second terminal of the supply switch 122. The multiplexer 120 has a second terminal of the second side coupled to the second terminals of the switching and reference switches 124, 126.

The supply switch 122 and the switch switching 124 may be High Voltage (HV) switches. Otherwise, reference switch 126 may be a Low Voltage (LV) switch. As described herein, a high voltage (or HV) refers to voltages greater than 5V and a low voltage (or LV) refers to voltages that are less than 5V.

The first clamp transistor 128 has a first conduction terminal coupled to the second terminal of the supply switch 122, a second conduction terminal coupled to a reference voltage node 170 and a control terminal. The second clamp transistor 130 has a first conduction terminal coupled to the second terminals of the switching and reference switches 124, 126, a second conduction terminal coupled to the reference voltage node 170 and a control terminal.

The controller 132 may be coupled to the control terminals of the first and second clamp transistors 128, 130, control terminals of the supply, switching and reference switches 122, 124, 126, one or more control terminals of the multiplexer 120 and inputs of the high side and low side driving stages 108, 110. The controller 132 may output control signals to the transistors 128, 130, switches 122, 124, 126, multiplexer 120 and driving stages 108, 110. The control signals may be asserted (e.g., high, activated or logical one) or deasserted (e.g., low, deactivated or logical zero). The control signals may cause each of the transistors 128, 130 and switches 122, 124, 126 to operate in a conductive or nonconductive state for testing the bonding wires as described herein. The one or more control signals output to the multiplexer 120 may cause the multiplexer to couple the feedback node 112 to either the supply switch 122 or the switching and reference switches 124, 126. The control signals output to the driving stages 108, 110 cause the driving stages 108, 110 to respectively transition the high side and low side transistors 104, 106 to the conductive or nonconductive state.

Figure 2:
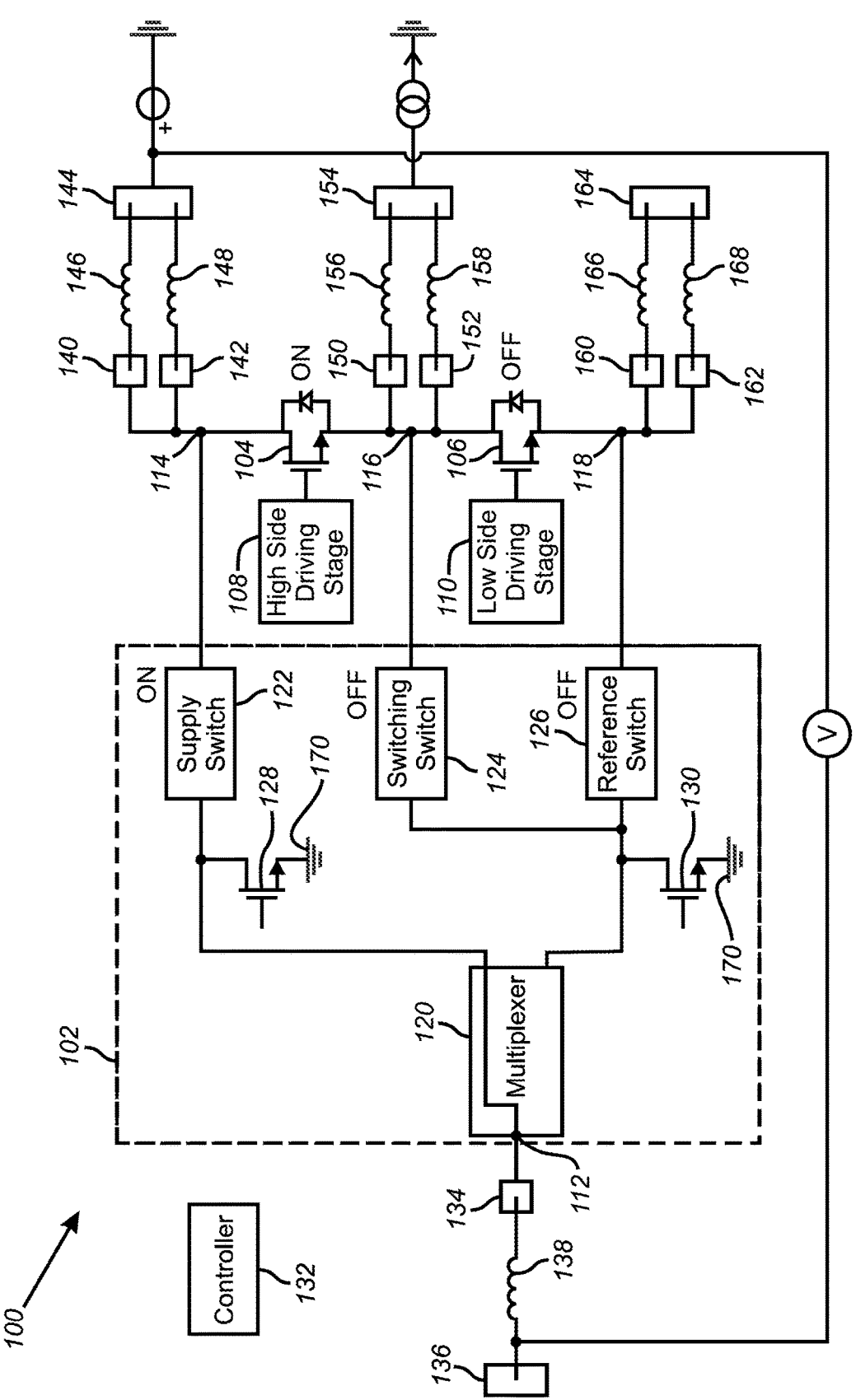
FIG. 2 shows a configuration of the wire bonding test circuit for testing first and second supply bonding wires.

FIG. 2 shows a configuration of the wire bonding test circuit 102 for testing the first and second supply bonding wires 146, 148. In the configuration, the controller 132 controls the driving stages 108, 110 to cause the high side transistor 104 to be conductive and the low side transistor 106 to be nonconductive. The controller 132 controls the supply switch 122 to be conductive and the switching and reference switches 124, 126 to be nonconductive. The controller 132 controls the multiplexer to couple the feedback pad 134 to the supply switch 122. The first clamp transistor 128 is controlled to be off, while the second clamp transistor 130 is controlled to be conductive to mitigate noise from the other paths.

Accordingly, the wire bonding test circuit 102 provides a path between the feedback pin 136 and the supply node 114. The path enables measuring the resistance between the supply node 114 and the supply pin 144. To test the bonding of the first and second supply bonding wires 146, 148, a voltage is supplied to the supply pin 144 (for example, by an external voltage source) and an active load (current source) sinks current from the switching pin 154. The current source may have a current value that is known. The voltage results in the passage of current from the supply pin 144 to one, both or none of the supply bonding wires 146, 148. Current will pass through only one bonding wire if the other bonding wire is an open circuit or is not bond to supply pin 144 or its respective pad. If both bonding wires are bond to their respective pads and the supply pin and the bonding wires are not an open circuit, then current will pass through both bonding wires 146, 148. Because the high side transistor 104 is on, the current will flow through the high side transistor 104 to the switching node 116 and to the switching pin 154.

Simultaneously with supplying the voltage, a voltmeter may be coupled to the supply pin 144 and the feedback pin 136. The voltmeter measures the voltage drop between the supply node 114 and the supply pin 144. Given that the current path is through the high side transistor 104 and not the supply switch 122, the voltage drop sensed by the voltmeter is between supply node 114 and the supply pin 144. The value of the current passing between the supply node 114 and the supply pin 144 may be known from the current source coupled to the switching pin 154. The voltage drop may be divided by the value of the current to determine the resistance between the supply node 114 and the supply pin 144. The determined resistance may be compared to a nominal resistance of the bonding wire 146, 148. The resistances of the bonding wires of the converter 100 may be the same or may be comparable and may correspond to each other. For example, the nominal resistance of a bonding wire may be 20, 30 or 40 milliohms, among others. If the determined resistance corresponds to half the nominal resistance, then both bonding wires 146, 148 are conductive. The determined resistance is expected to be halved when both bonding wires 146, 148 are conductive because the reciprocal of the equivalent resistance is the sum of the reciprocals of the constituent parallel resistances. However, if the determined resistance corresponds to the nominal resistance, then only one of the bonding wires 146, 148 is conductive and the other bonding wires is nonconductive. Furthermore, if current does not flow in the converter in the testing configuration, then both bonding wires are nonconductive.

Figure 3:
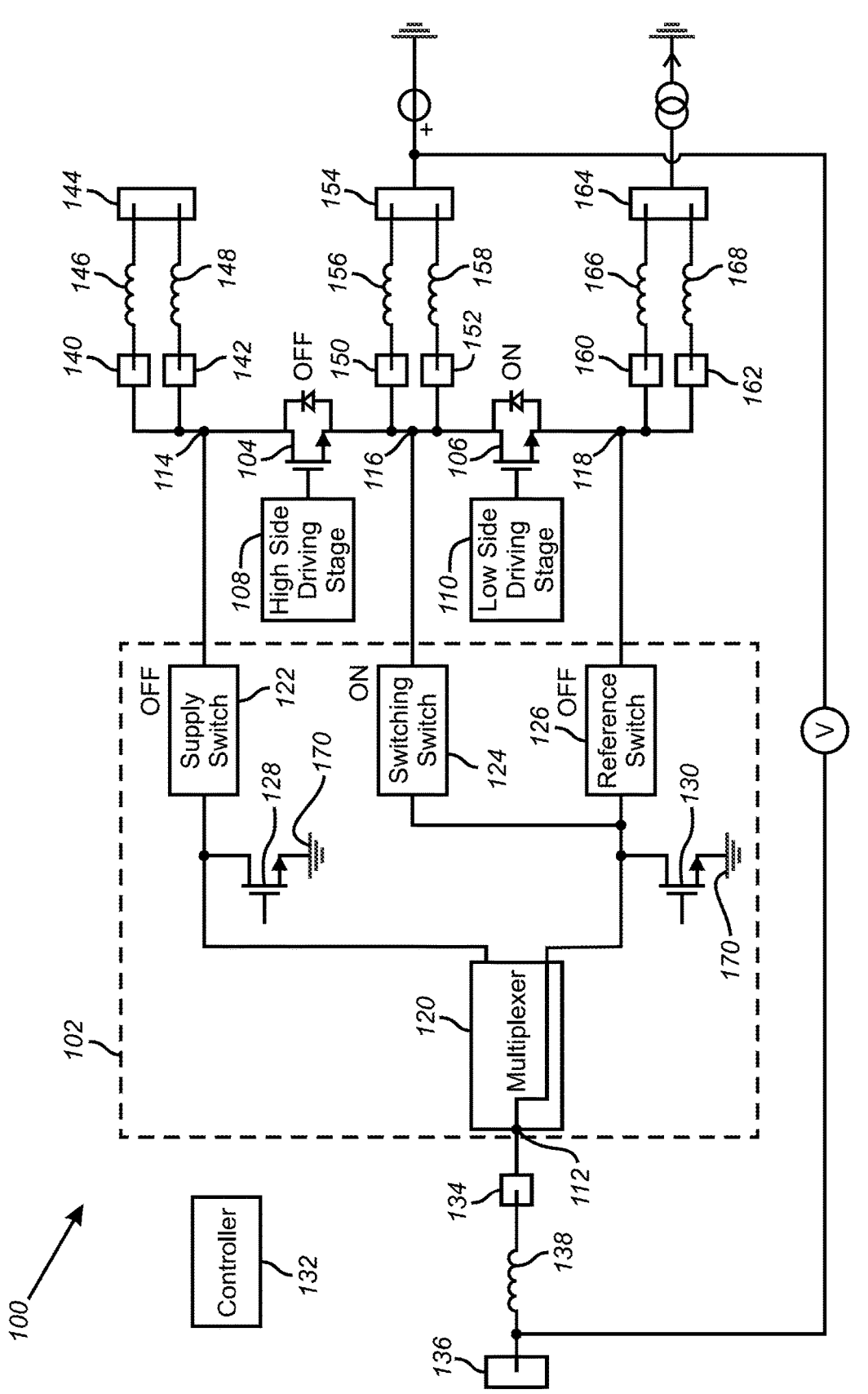
FIG. 3 shows a configuration of the wire bonding test circuit for testing first and second switching bonding wires.

FIG. 3 shows a configuration of the wire bonding test circuit 102 for testing the first and second switching bonding wires 156, 158. In the configuration, the controller 132 controls the driving stages 108, 110 to cause the high side transistor 104 to be nonconductive and the low side transistor 106 to be conductive. The controller 132 controls the supply and reference switches 122, 126 to be nonconductive and the switching switch 124 to be conductive. The controller 132 controls the multiplexer to couple the feedback pad 134 to the switching switch 124. The first clamp transistor 128 is controlled to be on, while the second clamp transistor 130 is controlled to be off.

The wire bonding test circuit 102 provides a path between the feedback pin 136 and the switching node 116. Similar to the supply bonding wires testing, to test the bonding of the first and second switching bonding wires 156, 158, voltage is supplied to the switching pin 154 and a current source sinks current from the reference pin 164. Current passes from the switching pin 154 to one, both or none of the switching bonding wires 156, 158 and then through the low side transistor 106 to the reference node 118 and to reference pin 164.

Simultaneously with supplying the voltage, a voltmeter may be coupled to the switching pin 154 and the feedback pin 136. The voltmeter measures the voltage drop between the switching node 116 and the switching pin 154. The voltage drop may be divided by the value of the current (as measured or determined from a current source) to determine the resistance between the switching node 116 and the switching pin 154. If the determined resistance corresponds to half of the bonding wire nominal resistance, then both bonding wires 156, 158 are conductive. That is due to the fact that adding a parallel resistance between two points reduces the equivalent resistance between the points. However, if the determined resistance corresponds to the nominal resistance, then only one of the bonding wires 156, 158 is conductive and the other bonding wires is nonconductive. Furthermore, if current does not flow in the converter in the testing configuration, then both bonding wires are nonconductive.

Figure 4:
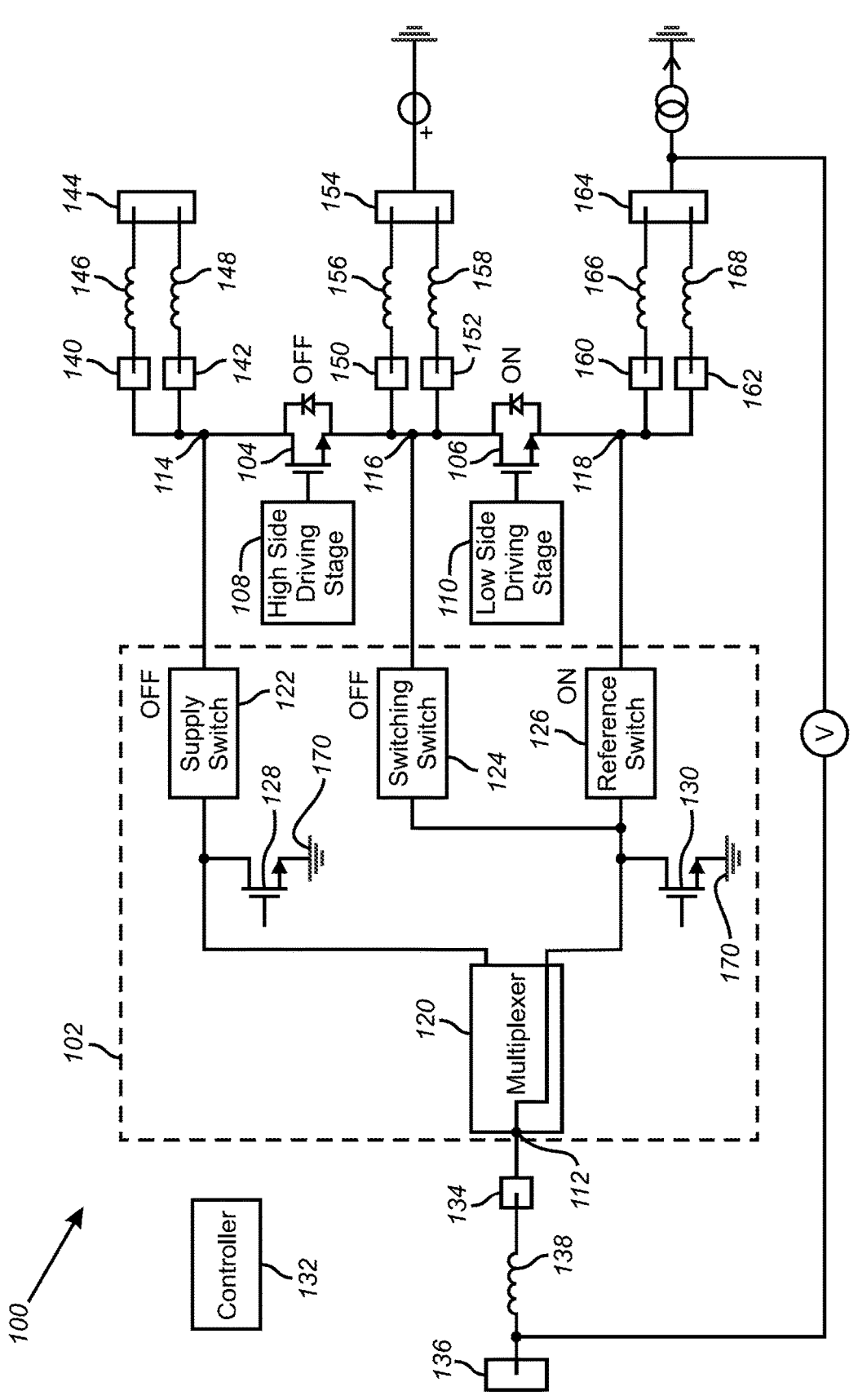
FIG. 4 shows a configuration of the wire bonding test circuit for testing the first and second reference bonding wires.

FIG. 4 shows a configuration of the wire bonding test circuit 102 for testing the first and second reference bonding wires 166, 168. In the configuration, the controller 132 controls the driving stages 108, 110 to cause the high side transistor 104 to be nonconductive and the low side transistor 106 to be conductive. The controller 132 controls the supply and switching switches 122, 124 to be nonconductive and the reference switch 126 to be conductive. The controller 132 controls the multiplexer to couple the feedback pad 134 to the reference switch 126. The first clamp transistor 128 is controlled to be on, while the second clamp transistor 130 is controlled to be off.

The wire bonding test circuit 102 provides a path between the feedback pin 136 and the reference node 118. Similar to the supply bonding wires testing and switching bonding wires testing, voltage is supplied to the switching pin 154 and a current source sinks current from the reference pin 164. Current passes from the switching pin 154 to one, both or none of the switching bonding wires 156, 158 and then through the low side transistor 106 to the reference node 118. From the reference node 118, current passes through one, both or none of the reference bonding wires 166, 168 and to the reference pin 164.

Simultaneously with supplying the voltage, a voltmeter may be coupled to the reference pin 164 and the feedback pin 136. The voltmeter measures the voltage drop between the reference node 118 and the reference pin 164. The voltage drop may be divided by the value of the current (as measured or determined from a current source) to determine the resistance between the reference node 118 and the reference pin 164 as described herein.

Figure 5:
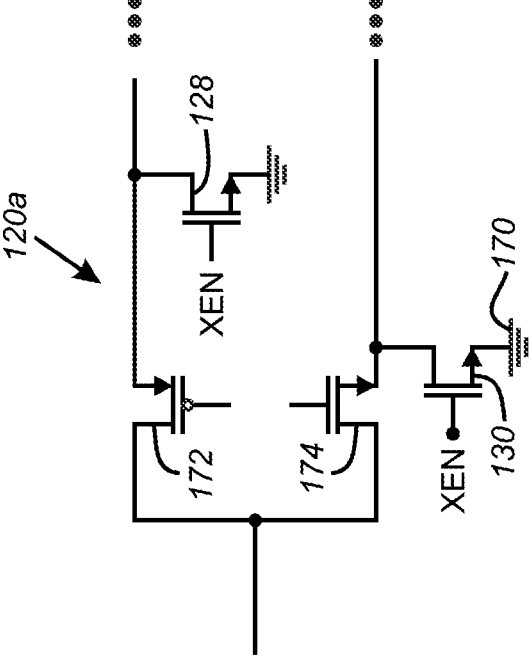
FIG. 5 shows an example of a multiplexer coupled to clamp transistors.

FIG. 5 shows an example of a multiplexer 120a coupled to the clamp transistors 128, 130. The multiplexer 120a includes first and second complementary transistors 172, 174. The first complementary transistor 172 has a first conduction terminal for coupling to the feedback node 112, a second conduction terminal for coupling to the supply switch 122 and a control terminal for receiving a control signal. The second complementary transistor 174 has a first conduction terminal for coupling to the feedback node 112, a second conduction terminal for coupling to the switching and reference switches 124, 126 and a control terminal for receiving the control signal. The control signal specifies the conduction path of the multiplexer 120a and the transistors 172, 174 have opposite conduction states with one being conductive and the other being non-conductive. It is noted that although the first complementary transistor 172 is shown as a p-channel metal-oxide-semiconductor field-effect transistor (mosfet) and the second complementary transistor 174 is shown as an n-channel mosfet (nmos) and the two transistors 172, 174 receive the same signal for complementary operation, any other arrangement may be used to achieve complementary switching.

The first and second clamp transistors 128, 130 receive a complementary enable signal (XEN). The clamp transistors 128, 130 clamp the multiplexer inputs during a functional/operational mode of the converter and clamp the unused input of the multiplexer during the multi-wire bonding testing.

When clamp transistors 128, 130 are non-conductive, the paths of the multiplexer 120a are decoupled from ground. Asserting the complementary enable signal (XEN) couples the paths of the multiplexer 120a to ground and decouples the multiplexer 120a from the switching and reference switches 124, 126 thereby disabling operation of the wire bonding test circuit 102.

It is noted that use of the multiplexer 120 allows for consolidating the paths for testing the supply, switching and reference bonding wires 146, 148, 156, 158, 166, 168 into one pin (the feedback pin 136). That forgoes the use of three separate output pins for the respective tests or the use of two pins, where one pin is used for testing the supply bonding wires 146, 148 and another pin is used for testing the switching and reference bonding wires 156, 158, 166, 168.

The feedback pin 136 may not be a dedicated pin for bonding wire testing. Instead, the feedback pin may have other uses during operation of the converter 100, half-bridge or device. The feedback pin 136 may be repurposed for bonding wire testing in a testing mode. For example, when bonding wire testing is not being performed, the supply, switching and reference switches 122, 124, 126 may be set to be non-conductive. Thus, the components of the wire bonding test circuit 102 are decoupled from the feedback pad 134. Other circuit components of the converter 100, half-bridge or chip may also be coupled to the feedback pad 134 and may use the feedback pin 136 for a different test or in an operational mode or non-test mode.

The first complementary transistor 172 may be a low voltage transistor, even though it is coupled to the supply pin 144. The supply switch 122 could be configured to protect the multiplexer from high voltage when the bonding wires test of the supply pin is not being performed. Moreover, the supply pin bonding wires test may be performed done using a low voltage as input supply (e.g., 5V). Accordingly, the first complementary transistor 172 may be a low voltage transistor. The second complementary transistor 174 may also be a low voltage transistor due to the fact that the multi-wire bonding test may be performed using a low voltage, and the second complementary transistor 174 may be protected by the switching switch 124 in functional mode or other test mode. If high voltage MOSFETs are used in the multiplexer and the switches 122, 124 are low voltage MOSFETs, then the source of transistors 172 and 174 may receive a high voltage. Due to the fact that the control signal for selecting the multiplexer path may be a low voltage signal (e.g., having logic zero indicated by reference voltage and logical one indicated by 5V), the source terminal of the transistors is at the high voltage power supply level. Consequently, the gate-to-source or source-to-gate voltage exceeds the maximum operative voltage (e.g., 5V).

Figure 6:
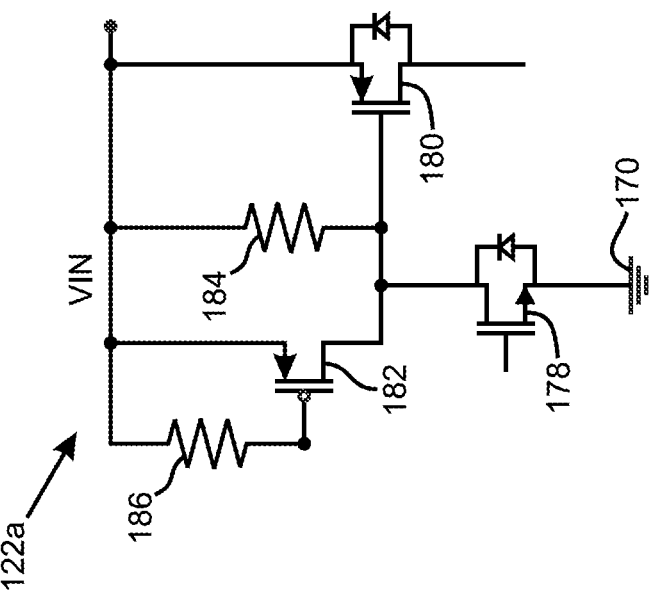
FIG. 6 shows an example of a supply switch.

FIG. 6 shows an example of the supply switch 122a. The supply switch 122a includes an input transistor 178, first and second transistors 180, 182 and first and second resistances 184, 186. The input transistors 178 has a first conduction terminal coupled to the reference voltage node 170, a second conduction terminal and a control terminal that receives a control signal. The control signal may be received from the controller 132, and the control signal dictates whether the input transistor 178 is in a conductive or nonconductive state. The first transistor 180 has a first conduction terminal configured to be coupled to the multiplexer 120, a second conduction terminal configured to be coupled to the supply node 114 and a control terminal coupled to the second conduction terminal of the input transistors 178. The first resistance 184 has a first terminal coupled to the control terminal of the first transistor 180 and the second terminal coupled to the supply node 114. The second transistor 182 has a first conduction terminal coupled to the control terminal of the first transistor 180, a second conduction terminal coupled to the supply node 114 and a control terminal. The second resistance 186 has a first terminal coupled to the control terminal of the second transistor 182 and a second terminal coupled to the supply node 114.

During testing, the control signal is asserted and the input transistors 178 is conductive. Accordingly, the control terminal of the first transistor 180 and the first terminal of the first resistance 184 are coupled to ground. The difference in voltage between the control terminal and the second conduction terminal of the first transistor 180 is the voltage of the supply node 114. Thus, the first transistor 180 operates in the conductive state. Concurrently, the voltage of the supply node 114 is applied to the control terminal of the second transistor 182 thereby causing the second transistor 182 to be nonconductive. It is noted that in the supply bonding wires test described with reference to FIG. 2, the supply voltage used may be compatible with low voltage circuitry and may be at most 5V.

The second transistor 182 and the second resistance 186 operate to mitigate or prevent the first transistor 180 from becoming conductive during an operational mode (or a non-testing mode of the converter) when the voltage of the supply node 114 may spike or oscillate.

During the operational mode, the control signal driving the input transistor 178 is deasserted and the input transistor 178 is nonconductive thereby decoupling the control terminal of the first transistor 180 and the first resistance 184 from ground. In the event that there is a spike in the supply voltage (VIN), a condition may be created whereby the first transistor 180 become conductive. The first resistance 184 delays the spike in the supply voltage (VIN). By the time the spike in the supply voltage (VIN) reaches the control terminal of the first transistor 180, the supply voltage (VIN) has decreased from the spike. Thus, a difference in voltage is applied between the control terminal and the second conduction terminal of the first transistor 180. The voltage difference may cause the first transistor 180 to become conductive during the operational mode of the half-bridge thereby disrupting operation of the half-bridge.

The second transistor 182 and the second resistance 186 mitigate the transition of the first transistor 180 to the conductive state during the operational mode. The second resistance 186 may be larger than the first resistance 184 and may, therefore, be associated with a longer parasitic delay than the first resistance 184. The spike reaches the control terminal of the first transistor 180 through the first resistance 184 in a faster manner and before it reaches the control terminal of the second transistor 182 through the second resistance 186. The spike passing through the first resistance 184 causes a voltage difference to occur between the control terminal and the second conduction terminal of the first transistor 180. The longer parasitic delay associated with the second resistance 186 delays the spike in the second resistance 186. The second transistor 182 remains conductive due to the fact that the voltage at its control and second conductive terminals is the same. The second transistor 182 shorts the control and second conductive terminals of the first transistor 180 thereby causing the first transistor 180 to be non-conductive. By the time the spike reaches the control terminal of the second transistor 186 (as to make the second transistor 186 non-conductive), the spike traversing the first resistance 184 (and reaching the control terminal of the first transistor 180) will have passed. Thus, by the time the second transistor 182 opens due to the spike, the first transistor 180 will have closed.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A power converter, comprising:
a plurality of nodes including first, second, third and fourth nodes; and
a wire bonding test circuit including:
a multiplexer having:
a first terminal of a first side coupled to the first node,
a second terminal of a second side, and
a third terminal of the second side;
a first switch having:
a first terminal coupled to the second terminal or the third terminal of the multiplexer, and
a second terminal coupled to the second node;
a second switch having:
a first terminal coupled to the second terminal or the third terminal of the multiplexer, and
a second terminal coupled to the third node; and
a third switch having:
a first terminal coupled to the second terminal or the third terminal of the multiplexer, and
a second terminal coupled to the fourth node;
a first switching transistor having a first conduction terminal coupled to the second node, a second conduction terminal coupled to the third node, and a control terminal configured to receive a first driving signal; and
a second switching transistor having a first conduction terminal coupled to the third node, a second conduction terminal coupled to the fourth node, and a control terminal configured to receive a second driving signal.

2. The power converter of claim 1, comprising:
a plurality of pads including first, second and third pads; and
a plurality of pins including first and second pins.

3. The power converter of claim 2, wherein:
the first node is coupled to the first pad, and the first pad is coupled to the first pin by a first bonding wire, and
the second node is coupled to the second and third pads, the second pad is coupled to the second pin by a second bonding wire, and the third pad is coupled to the second pin by a third bonding wire.

4. The power converter of claim 3, comprising:
a controller configured to operate the wire bonding test circuit in a first configuration in which a path is provided between the first and second pins for testing whether the second bonding wire or the third bonding wire is non-conductive, operating the wire bonding test circuit in the first configuration includes causing:

the multiplexer to be conductive between the first and second terminals of the multiplexer;

the first switch to be conductive; and the second and third switches to be non-conductive.

5. The power converter of claim 4, wherein, in the first configuration, the controller causes a first switching transistor of the power converter to be conductive and a second switching transistor of the power converter to be non-conductive.

6. The power converter of claim 2, wherein:

the first node is coupled to the first pad, and the first pad is coupled to the first pin by a first bonding wire, and the third node is coupled to the second and third pads, the second pad is coupled to the second pin by a second bonding wire, and the third pad is coupled to the second pin by a third bonding wire.

7. The power converter of claim 6, comprising:

a controller configured to operate the wire bonding test circuit in a second configuration in which a path is provided between the first and second pins for testing a conductivity of the second bonding wire or the third bonding wire, operating the wire bonding test circuit in the second configuration includes causing:

the multiplexer to be conductive between the first and third terminals of the multiplexer;

the second switch to be conductive; and the first and third switches to be non-conductive.

8. The power converter of claim 7, wherein, in the second configuration, the controller causes a first switching transistor of the power converter to be non-conductive and a second switching transistor of the power converter to be conductive.

9. The power converter of claim 2, wherein:

the first node is coupled to the first pad, and the first pad is coupled to the first pin by a first bonding wire, and the fourth node is coupled to the second and third pads, the second pad is coupled to the second pin by a second bonding wire, and the third pad is coupled to the second pin by a third bonding wire.

10. A power converter, comprising:

a plurality of nodes including first, second, third and fourth nodes; and a wire bonding test circuit including:

a multiplexer having:

a first terminal of a first side coupled to the first node, a second terminal of a second side, and a third terminal of the second side;

a first switch having:

a first terminal coupled to the second terminal or the third terminal of the multiplexer, and a second terminal coupled to the second node;

a second switch having:

a first terminal coupled to the second terminal or the third terminal of the multiplexer, and a second terminal coupled to the third node; and a third switch having:

a first terminal coupled to the second terminal or the third terminal of the multiplexer, and a second terminal coupled to the fourth node;

a plurality of pads including first, second and third pads; and a plurality of pins including first and second pins, wherein the first node is coupled to the first pad, and the first pad is coupled to the first pin by a first bonding wire, wherein the fourth node is coupled to the second and third pads, the second pad is coupled to the second pin by a second bonding wire, and the third pad is coupled to the second pin by a third bonding wire a controller configured to operate the wire bonding test circuit in a third configuration in which a path is provided between the first and second pins for testing a conductivity of the second bonding wire or the third bonding wire, operating the wire bonding test circuit in the third configuration includes causing:

the multiplexer to be conductive between the first and third terminals of the multiplexer;

the third switch to be conductive; and the first and second switches to be non-conductive.

11. The power converter of claim 10, wherein, in the third configuration, the controller causes a first switching transistor of the power converter to be non-conductive and a second switching transistor of the power converter to be conductive.

12. A method, comprising:

operating a multiplexer of a wire bonding test circuit to couple a first terminal of the multiplexer to a second terminal of the multiplexer or to couple the first terminal of the multiplexer to a third terminal of the multiplexer, wherein the first terminal of the multiplexer is coupled to a first node of a power converter;

operating a first switch of the wire bonding test circuit in a conductive or a non-conductive state, wherein the first switch has a first terminal coupled to the second terminal or the third terminal of the multiplexer and a second terminal coupled to a second node of the power converter;

operating a second switch of the wire bonding test circuit in a conductive or a non-conductive state, wherein the second switch has a first terminal coupled to the second terminal or the third terminal of the multiplexer and a second terminal coupled to a third node of the power converter; and operating a third switch of the wire bonding test circuit in a conductive or a non-conductive state, wherein the third switch has a first terminal coupled to the second terminal or the third terminal of the multiplexer and a second terminal coupled to a fourth node of the power converter, wherein the power converter includes:

a first switching transistor having a first conduction terminal coupled to the second node, a second conduction terminal coupled to the third node, and a control terminal configured to receive a first driving signal; and a second switching transistor having a first conduction terminal coupled to the third node, a second conduction terminal coupled to the fourth node, and a control terminal configured to receive a second driving signal.

13. The method of claim 12, wherein the power converter includes:

a plurality of pads including first, second and third pads; and a plurality of pins including first and second pins.

14. The method of claim 13, wherein:

the first node is coupled to the first pad, and the first pad is coupled to the first pin by a first bonding wire, and the second node is coupled to the second and third pads, the second pad is coupled to the second pin by a second bonding wire, and the third pad is coupled to the second pin by a third bonding wire.

15. The method of claim 14, comprising:

operating, by a controller, the wire bonding test circuit in a first configuration in which a path is provided between the first and second pins for testing whether the second bonding wire or the third bonding wire is non-conductive, operating the wire bonding test circuit in the first configuration includes causing:

the multiplexer to be conductive between the first and second terminals of the multiplexer;

the first switch to be conductive; and the second and third switches to be non-conductive.

16. The method of claim 15, comprising:

in the first configuration, operating, by the controller, a first switching transistor of the power converter to be conductive and a second switching transistor of the power converter to be non-conductive.

17. The method of claim 13, wherein:

the first node is coupled to the first pad, and the first pad is coupled to the first pin by a first bonding wire, and the third node is coupled to the second and third pads, the second pad is coupled to the second pin by a second bonding wire, and the third pad is coupled to the second pin by a third bonding wire.

18. The method of claim 17, comprising:

operating, by a controller, the wire bonding test circuit in a second configuration in which a path is provided between the first and second pins for testing a conductivity of the second bonding wire or the third bonding wire, operating the wire bonding test circuit in the second configuration includes causing:

the multiplexer to be conductive between the first and third terminals of the multiplexer;

the second switch to be conductive; and the first and third switches to be non-conductive.

19. The power converter of claim 10, further comprising:

a first switching transistor having a first conduction terminal coupled to the second node, a second conduction terminal coupled to the third node, and a control terminal configured to receive a first driving signal; and a second switching transistor having a first conduction terminal coupled to the third node, a second conduction terminal coupled to the fourth node, and a control terminal configured to receive a second driving signal.

\* \* \* \* \*